(12) United States Patent
Reynolds et al.

(10) Patent No.: US 9,854,711 B2
(45) Date of Patent: Dec. 26, 2017

(54) DIRECTIONAL GRATE ACCESS FLOOR PANEL

(71) Applicant: TATE ACCESS FLOORS LEASING, INC., Wilmington, DE (US)

(72) Inventors: Bill W. Reynolds, Pasadena, MD (US); Daniel B. Kennedy, Lovettsville, VA (US)

(73) Assignee: TATE ACCESS FLOORS LEASING, INC., Wilmington, DE (US)

(*) Notice: Subject to any disclaimer, the term of this patent is extended or adjusted under 35 U.S.C. 154(b) by 96 days.

(21) Appl. No.: 15/137,843

(22) Filed: Apr. 25, 2016

(65) Prior Publication Data

US 2016/0242325 A1    Aug. 18, 2016

Related U.S. Application Data

(63) Continuation of application No. 14/221,974, filed on Mar. 21, 2014, now Pat. No. 9,326,428, which is a
(Continued)

(51) Int. Cl.
| | |
|---|---|
| *H05K 7/20* | (2006.01) |
| *E04F 15/00* | (2006.01) |
| *E04F 15/024* | (2006.01) |
| *F24F 13/00* | (2006.01) |
| *F24F 13/068* | (2006.01) |
| *E04F 15/02* | (2006.01) |
| *F24F 13/075* | (2006.01) |

(52) U.S. Cl.
CPC ... *H05K 7/20745* (2013.01); *E04F 15/02177* (2013.01); *E04F 15/02405* (2013.01); *F24F 13/068* (2013.01); *F24F 13/075* (2013.01)

(58) Field of Classification Search
CPC .......... H05K 7/20745; E04F 15/02177; E04F 15/02405; F24F 13/075; F24F 13/068
See application file for complete search history.

(56) References Cited

U.S. PATENT DOCUMENTS

| | | |
|---|---|---|
| 628,459 A | 7/1899 | Goll |
| 1,265,055 A | 5/1918 | Clover |
| | (Continued) | |

FOREIGN PATENT DOCUMENTS

| | | |
|---|---|---|
| DE | 20 2009 007 257 U1 | 10/2009 |
| EP | 0 372 784 A2 | 6/1990 |
| | (Continued) | |

OTHER PUBLICATIONS

Oct. 25, 2011 Written Opinion of the International Searching Authority issued in International Application No. PCT/US2011/047738.

(Continued)

*Primary Examiner* — Jeanette E Chapman
(74) *Attorney, Agent, or Firm* — Oliff PLC

(57) ABSTRACT

A grate access floor panel comprising a support frame and a plurality of vanes supported by the frame, each of the plurality of vanes having an upstream end and a downstream end with respect to a direction of airflow across the plurality of vanes and faces that extend between the upstream and downstream ends, wherein at least some of the vanes have openings that extend through the faces thereof and have angled tips.

10 Claims, 8 Drawing Sheets

Related U.S. Application Data continuation of application No. 12/878,657, filed on Sep. 9, 2010, now Pat. No. 8,733,060.

(56) References Cited

U.S. PATENT DOCUMENTS

| | | | |
|---|---|---|---|
| 1,390,347 A * | 9/1921 | Elliston | F24F 13/06 454/330 |
| 1,580,215 A | 4/1926 | Nygaard | |
| 1,652,128 A * | 12/1927 | Hare | F24F 13/075 454/309 |
| 2,056,318 A | 10/1936 | Hammond | |
| 2,074,518 A * | 3/1937 | Sandberg | F24F 13/081 138/DIG. 4 |
| 2,140,935 A * | 12/1938 | Hart | F24F 13/075 16/429 |
| 2,378,012 A | 6/1945 | Herbster | |
| 2,560,802 A * | 7/1951 | Lambert | F24F 13/075 454/309 |
| 2,621,578 A * | 12/1952 | Labus | F24F 13/075 454/314 |
| 2,625,873 A * | 1/1953 | Kennedy | F24F 13/075 454/314 |
| 2,811,093 A | 10/1957 | Lathrop | |
| 3,035,504 A | 5/1962 | Cline et al. | |
| 3,065,685 A | 11/1962 | Sylvester et al. | |
| 3,093,060 A | 6/1963 | Emery | |
| 3,127,821 A * | 4/1964 | Lebaron, Jr. | E03F 5/06 210/163 |
| 3,139,108 A | 6/1964 | Klingman | |
| 3,177,797 A * | 4/1965 | Kennedy | F24F 13/075 454/319 |
| 3,319,558 A * | 5/1967 | Bodian | E04B 9/02 454/296 |
| 3,347,146 A | 10/1967 | Larkfeldt et al. | |
| 3,391,629 A * | 7/1968 | Snell | F24F 13/075 454/290 |
| 3,564,820 A * | 2/1971 | Nelson | B01D 45/02 55/306 |
| 3,660,956 A | 5/1972 | Budlong | |
| 3,721,067 A | 3/1973 | Agnew | |
| 3,727,537 A | 4/1973 | Harty, Jr. | |
| 3,752,056 A | 8/1973 | Chamberlin et al. | |
| 3,864,887 A * | 2/1975 | Arens | E04F 19/10 4/506 |
| 4,282,695 A | 8/1981 | Lew | |
| 4,566,243 A | 1/1986 | Dahlin | |
| 4,874,127 A * | 10/1989 | Collier | F24F 3/044 165/205 |
| 5,192,348 A | 3/1993 | Ludwig | |
| 5,324,229 A | 6/1994 | Weisbecker | |
| 5,454,756 A | 10/1995 | Ludwig | |
| 5,468,186 A | 11/1995 | Bolton et al. | |
| 5,505,379 A * | 4/1996 | Wagner | F24F 13/075 236/101 D |
| 5,607,354 A * | 3/1997 | Mill | F24F 1/02 454/186 |
| 5,616,389 A | 4/1997 | Blatz | |
| 5,697,841 A | 12/1997 | Di Giovine | |
| 5,718,628 A | 2/1998 | Nakazato et al. | |
| 5,851,143 A | 12/1998 | Hamid | |
| 6,019,677 A * | 2/2000 | Demster | F24F 7/10 454/289 |
| 6,101,768 A | 8/2000 | Springstead et al. | |
| 6,273,184 B1 * | 8/2001 | Nishishita | F28D 1/0435 165/140 |
| 6,374,627 B1 | 4/2002 | Schumacher et al. | |
| 6,474,559 B2 | 11/2002 | Park | |
| 6,747,872 B1 * | 6/2004 | Patel | G06F 1/20 165/104.33 |
| 6,862,179 B2 * | 3/2005 | Beitelmal | F25D 17/06 361/679.53 |
| 7,031,154 B2 | 4/2006 | Bash et al. | |
| 7,057,506 B2 | 6/2006 | Bash et al. | |
| 7,232,369 B2 | 6/2007 | Karidis et al. | |
| 7,347,058 B2 * | 3/2008 | Malone | F24F 13/12 236/49.3 |
| D567,398 S | 4/2008 | Meyer | |
| D588,716 S | 3/2009 | Meyer | |
| 7,597,617 B2 | 10/2009 | Solberg et al. | |
| 7,644,550 B2 | 1/2010 | Meyer | |
| 7,716,939 B1 | 5/2010 | Morales | |
| 7,823,340 B2 | 11/2010 | DeJonge et al. | |
| 7,907,402 B2 | 3/2011 | Caveney | |
| 2005/0225936 A1 | 10/2005 | Day | |
| 2007/0125107 A1 | 6/2007 | Beam | |
| 2007/0213000 A1 | 9/2007 | Day | |
| 2008/0274685 A1 | 11/2008 | DeJonge et al. | |
| 2009/0129015 A1 | 5/2009 | Nobile | |
| 2009/0151271 A1 | 6/2009 | Meyer | |
| 2009/0156114 A1 | 6/2009 | Ahladas et al. | |
| 2009/0168345 A1 | 7/2009 | Martini | |
| 2009/0293518 A1 * | 12/2009 | Bettella | F04D 25/12 62/186 |
| 2009/0320393 A1 | 12/2009 | Meyer et al. | |
| 2010/0180520 A1 | 7/2010 | Meyer | |
| 2010/0180539 A1 | 7/2010 | Meyer | |
| 2011/0051430 A1 | 3/2011 | Chen | |
| 2012/0009862 A1 | 1/2012 | Meyer | |
| 2012/0156981 A1 * | 6/2012 | Curtin | H05K 7/20836 454/184 |

FOREIGN PATENT DOCUMENTS

| | | |
|---|---|---|
| EP | 0 459 135 A1 | 12/1991 |
| GB | 2 174 193 A | 10/1986 |
| JP | 2000/023858 A | 1/2000 |
| WO | 2007/054578 A1 | 5/2007 |
| WO | 2010/004082 A1 | 1/2010 |

OTHER PUBLICATIONS

Oct. 25, 2011 International Search Report issued in International Application No. PCT/US2011/047738.

\* cited by examiner

DIRECTIONAL GRATE ACCESS FLOOR PANEL

RELATED APPLICATION

This application is a continuation application of application Ser. No. 14/221,974 filed on Mar. 21, 2014 and entitled "Directional Grate Access Floor Panel," which in turn is a continuation application of application Ser. No. 12/878,657 filed on Sep. 9, 2010 and entitled "Directional Grate Access Floor Panel."

BACKGROUND

1. Field of the Invention

This invention relates to grate panels for access flooring systems. In particular, this invention relates to access floor panels having grates that direct cooling air from the plenum between the sub-floor and the access panel array through the array.

2. Background of the Invention

A typical data center includes multiple IT racks. Those racks, and the associated peripheral equipment and cables, generate a relatively high amount of heat. Because of that heat, providing adequate cooling to IT racks in the data center is of paramount importance. Moreover, it is desirable that the IT racks be cooled as efficiently as possible, as the energy costs to cool IT racks may approach a large percentage of the energy costs to operate the data center.

Data centers typically have a raised floor system, often called an access floor system. An access floor system is usually comprised of a continuous array of floor panels, arranged edge-to-edge, and supported above the sub-floor by support structure. The array of access floor panels usually extends wall-to-wall in the data centers.

A plenum is formed between the sub-floor and the access floor panel array. The cables and other equipment run through the plenum, and the plenum is also used as a conduit for cooling air. Often, one or more air conditioning units supply air to the plenum, and some of the access floor panels in the array have grates. The cooling air passes through the grates into the data center.

U.S. Pat. No. 6,747,872 discloses a typical cooling system for a data center. In the system of U.S. Pat. No. 6,747,872, cool air from an air conditioner passes through the plenum between the sub-floor and the access panel array to grates in the array. The cool air then passes through those grates to spaces adjacent to the IT racks. However, the perforated panels or grates disclosed in systems such as that in U.S. Pat. No. 6,747,872 merely provide the cool air in a vertical plume between the IT racks.

SUMMARY OF THE INVENTION

In view of the above, it is desirable to provide a directional grate panel for access floor systems that directs cooling air from the plenum between the sub-floor and the access floor panel array directly and evenly to faces of IT racks in a data center, resulting in more consistent temperature throughout the height of the IT racks and more economic cooling of the racks.

A directional grate according to one embodiment may comprise a plurality of spaced vanes provided within a support frame, each of the plurality of vanes having an upstream portion and a downstream portion with respect to a direction of airflow across the plurality of vanes; and a plurality of openings provided in at least some of the plurality of vanes. The downstream portion of at least some of the vanes of the plurality of vanes may be angled with respect to their upstream portions.

In another embodiment, the plurality of openings may be circular in shape. Alternatively, the plurality of openings may be any other geometric or non-geometric shape.

In a further embodiment, some of the vanes of the plurality of vanes may have at least a portion that is angled at a same angle of inclination with respect to a vertical axis. The angle of inclination may be between 20° and 35°. In yet another embodiment, the plurality of vanes may include two or more groups of vanes that have at least portions that are angled at first and second angles of inclination, respectively.

In yet another embodiment, all of the plurality of vanes may have openings that extend through the faces thereof. In one aspect, each of the vanes of the plurality of vanes may have a same pattern of openings. The support frame may have at least one peripheral member that has openings therethrough that align with the openings in at least some of the vanes. Additionally, the openings may be formed as a plurality of partial cutouts along one edge of the plurality of vanes. Further, the openings may be equally spaced in each vane of the plurality of vanes. The openings also may be of equal size in each vane of the plurality of vanes, and a same pattern of openings may be provided in some of the vanes of the plurality of vanes.

In another embodiment, the grate access floor panel may comprise a support frame and a plurality of spaced vanes having front and rear faces, wherein at least some of the plurality of spaced vanes may have openings through the faces thereof that permit airflow through the plurality of spaced vanes as well as between adjacent vanes of the plurality of spaced vanes. The airflow through the plurality of spaced vanes results in more even distribution of air through the grate access floor panel.

DETAILED DESCRIPTION

Figure 1:
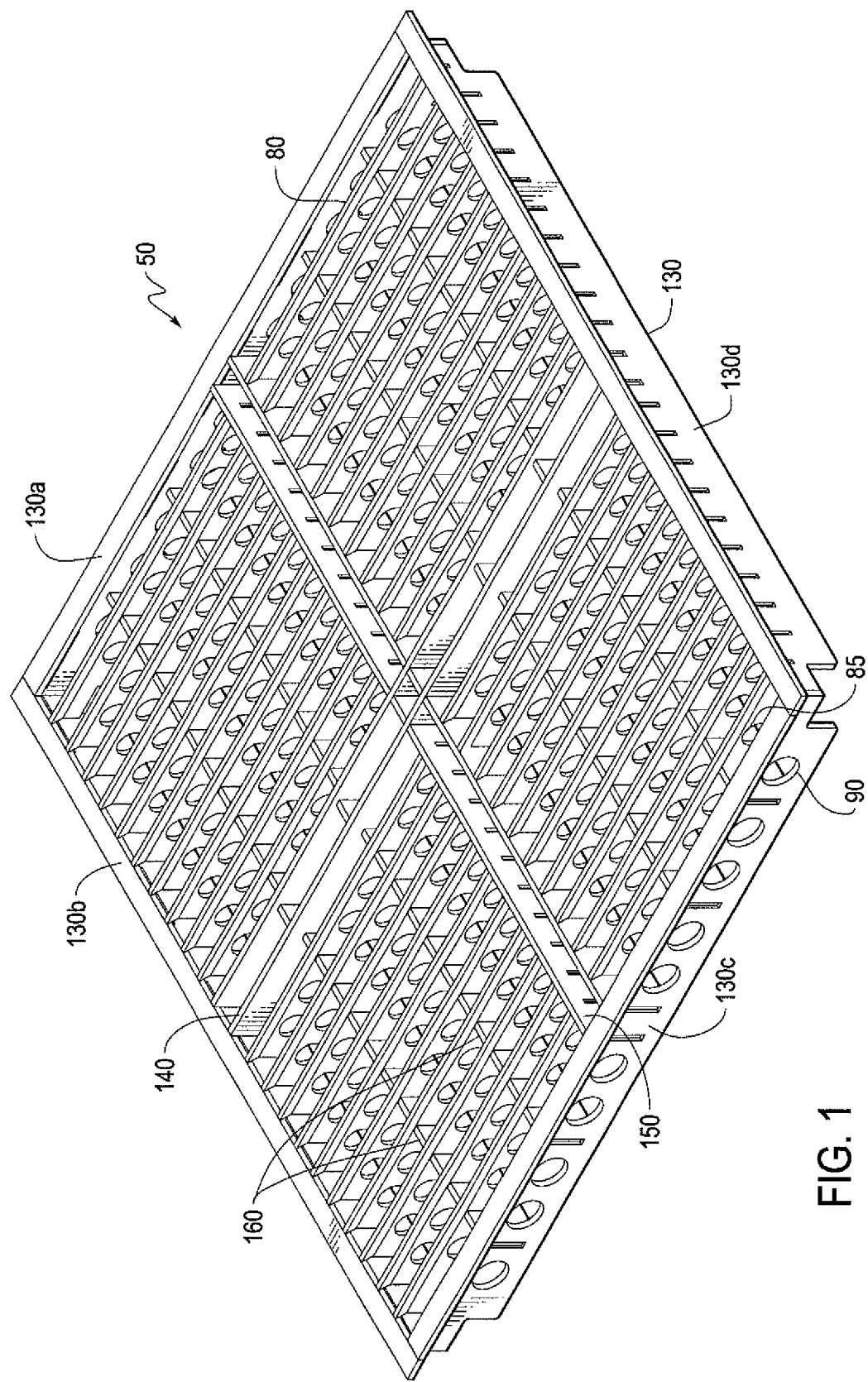
FIG. 1 is a top perspective view of a directional grate panel according to one embodiment of this invention.
Figure 2:
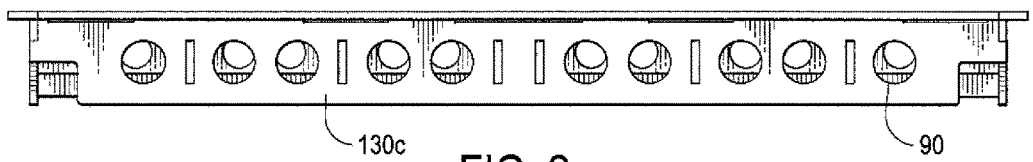
FIG. 2 is a front view of the embodiment of FIG. 1.
Figure 3:
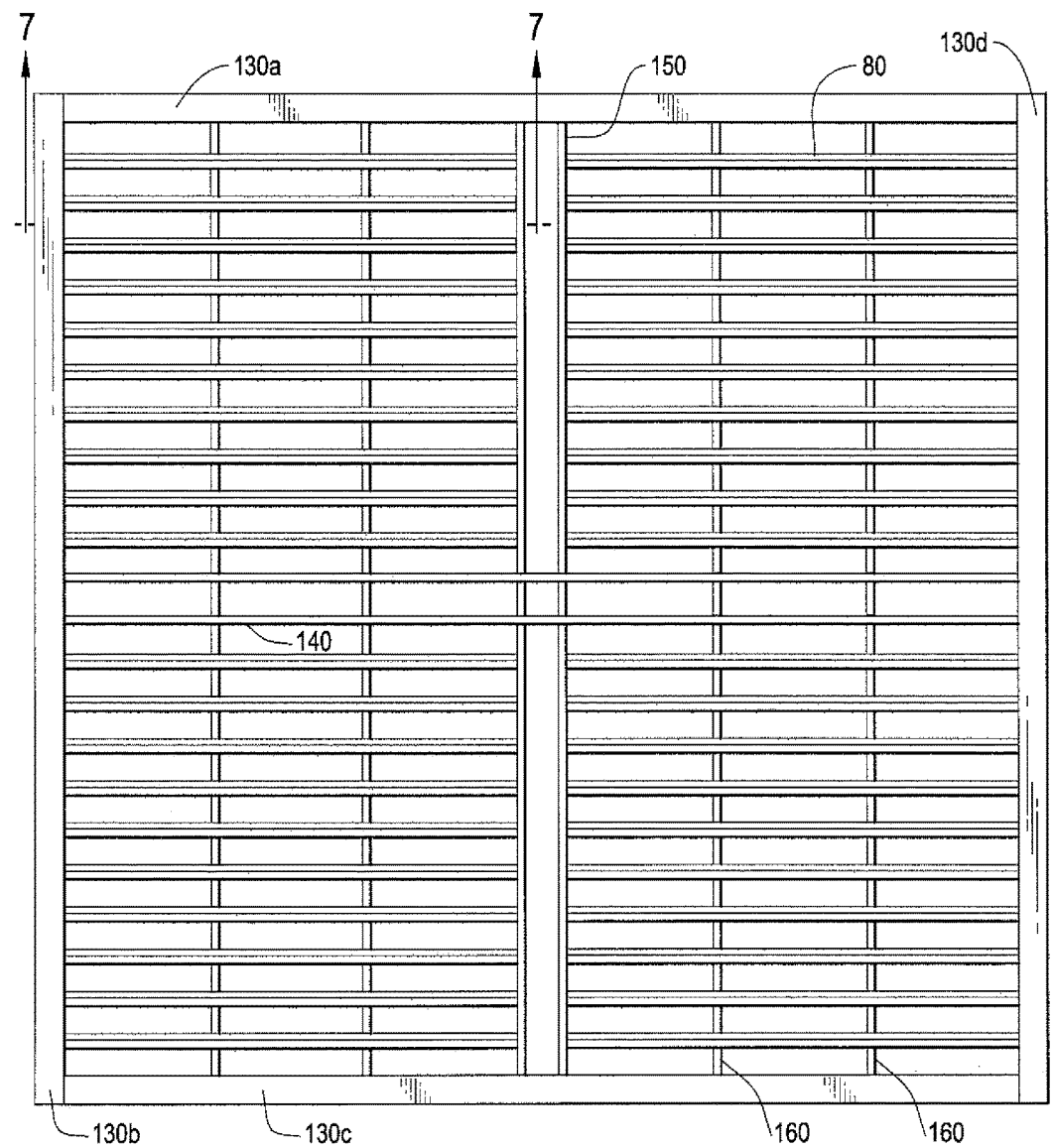
FIG. 3 is a top view of the embodiment of FIG. 1.
Figure 4:
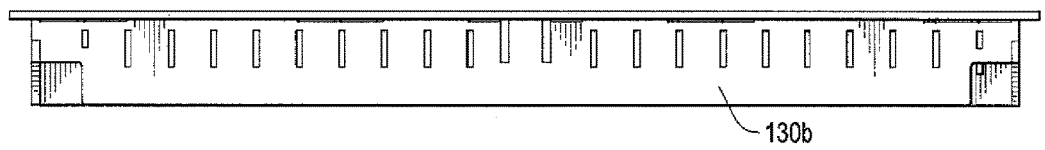
FIG. 4 is a side view of the embodiment of FIG. 1.
Figure 5:
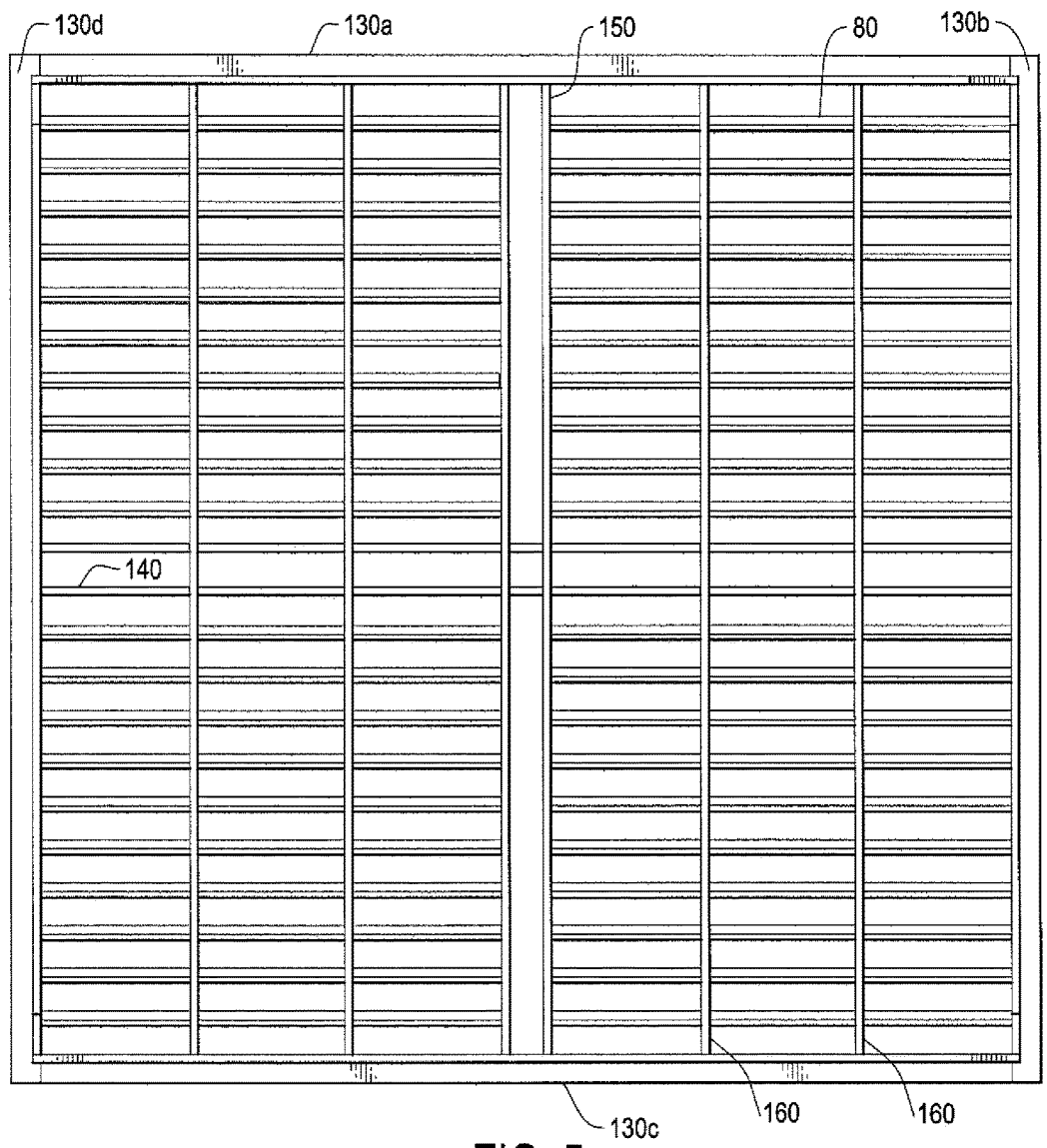
FIG. 5 is a bottom view of the embodiment of FIG. 1.
Figure 6:
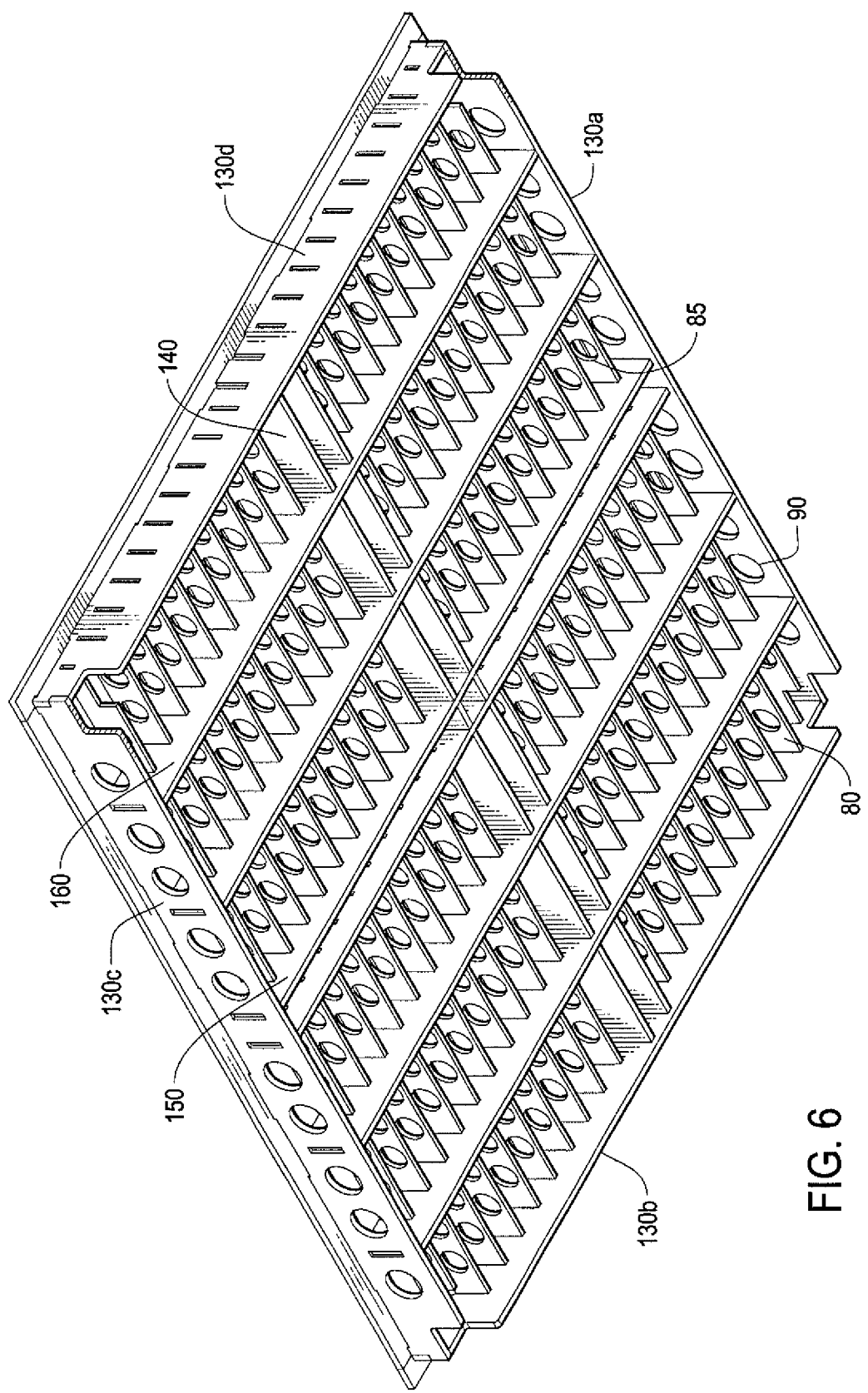
FIG. 6 is a bottom perspective view of the embodiment of FIG. 1.

FIG. 1 is a top perspective view of the directional grate panel 50. The directional grate panel 50 can be made of any material that is capable of providing the structural rigidity required for a given application. Preferably the directional grate panel 50 is made of a metal.

The directional grate panel 50 includes a frame 130. In this embodiment, frame 130 includes a square outer frame consisting of members 130a, 130b, 130c and 130d, and a plurality of cross members 140, 150 and 160 that are provided for structural support. The necessity and number of cross members 140, 150 and 160 varies depending on the application.

The directional grate panel 50 includes a plurality of vanes 80, which, in this embodiment, are substantially parallel to frame members 130a, 130c and 140. The vanes 80 may extend between one of frame members 130b and 130d and support members 150, as shown in the figures, or vanes 80 may extend all the way between frame members 130b and 130d. Vanes 80 may form parallel rows. The number of vanes 80 may vary as desired, depending on the application.

Figure 8:
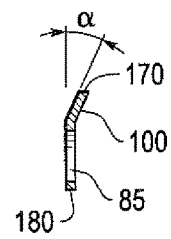
FIG. 8 is a partial cross-sectional view of a vane taken along lines 8-8 in FIG. 7.

Vanes 80 have a downstream end 170 and an upstream end 180 (see FIG. 8). "Downstream" and "upstream" are defined relative to the direction of airflow through the directional grate panel 50. Vanes 80 have opposing faces that extend between the downstream end 170 and the upstream end 180.

Figure 7:
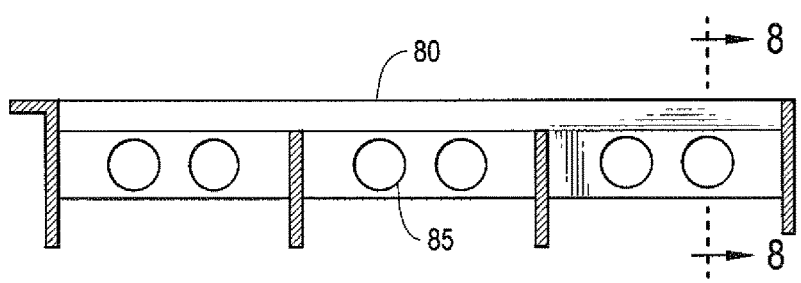
FIG. 7 is a partial cross-sectional view taken along lines 7-7 in FIG. 3.

Vanes 80 have holes (or openings) 85. See FIG. 7. While holes 85 are shown as a single row of spaced circular openings in FIG. 7, the holes 85 can be of any shape and can be arranged in any pattern or randomly. The holes 85 do not have to have the same pattern or size in all the vanes 80. In fact, the holes in adjacent vanes 80 can be of different sizes and patterns. In addition, some vanes 80 may have a different number of holes 85 than other vanes 80. For example, one vane 80 may have only four holes 85, whereas another vane 80 may have five holes.

Also, not all of the vanes 80 must have holes 85. Rather, only selected vanes 80, or sets of vanes 80, may have holes 85.

Figure 10:
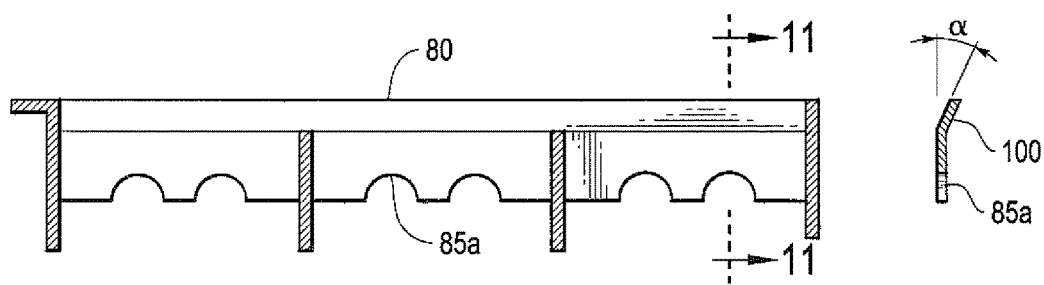
FIG. 10 is a partial cross sectional view of the vane of another embodiment.
Figure 11:
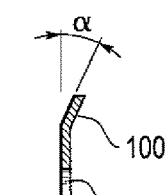
FIG. 11 is a partial cross-sectional view of the vane of FIG. 10 taken along lines 11-11 in FIG. 10.

Further, the holes do not have to be "in" the vanes. Rather, the holes or openings can be partially formed by the vanes, as illustrated, for example, in FIG. 10, which illustrates partial cross sectional views of the vanes of another embodiment of this invention. In the embodiment illustrated in FIG. 10, the openings 85a are in the form of partial cutouts along one edge of the vane 80. In particular, FIG. 10 illustrates an embodiment in which the openings are in the form of semi-circular cutouts formed in a vane. While the openings 85a in FIG. 10 are semi-circular in shape, the openings 85a can be of any shape and spaced as desired along the vane 80. The shape of the openings 85a can vary in a given vane 80, and the openings 85a can be spaced equally, in any pattern or randomly in a given vane 80. FIG. 11 is a cross sectional view of the vane illustrated in FIG. 10.

The holes 85 or openings 85a in the vanes 80 have many functions. For instance, they reduce the weight of directional grate panel 50. They also cause a more turbulent airflow as the air passes along the directional grate panel 50 to be directed through it, which reduces air velocity, helps distribute air across the vanes evenly, and equalizes pressure.

In the embodiment illustrated by FIGS. 1-8, frame members 130a and 130c (see the side view of FIG. 3) are provided with through holes 90, which substantially line up with holes 85 in the end vanes 80.

When the directional grate panel 50 is installed in an access floor panel array, the holes 85 and the through holes 90 are substantially aligned with a direction of the airflow 70.

Figure 12:
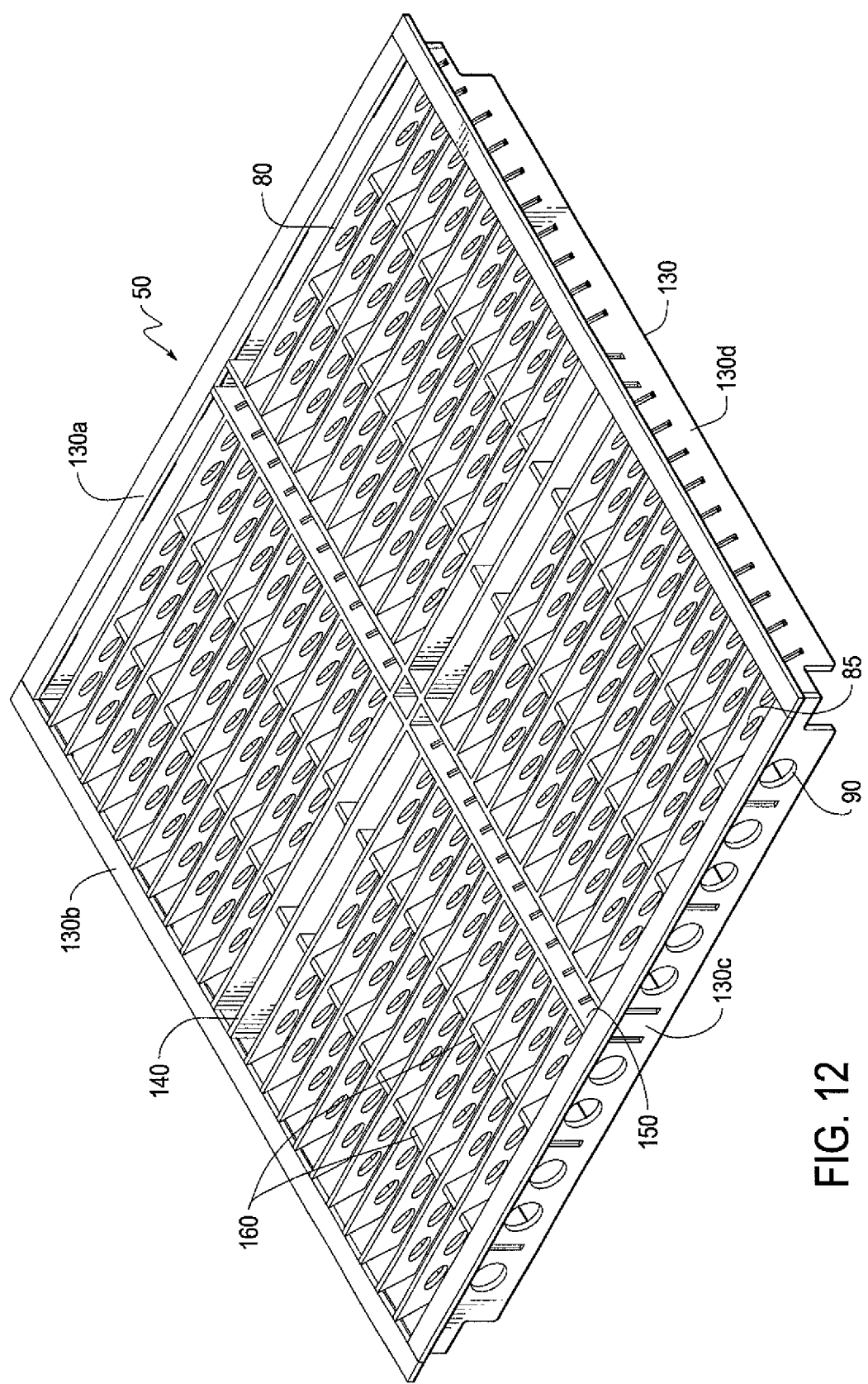
FIG. 12 is a directional grate panel according to a further embodiment of this invention.

In the embodiments illustrated in the Figures, the vanes 80 have an angled tip. In particular, an upper portion defining a vane tip 100 is angled with respect to the rest of the vane 80. The vane tip 100 is on a downstream end 170 of the vane 80 with respect to a direction of airflow through the directional grate panel 50. In other embodiments, the vanes can be flat, but angled with regard to the airflow direction, as shown in FIG. 12. The vanes can have any other shape, such as curved, that directs air as desired.

The angle of inclination α of the vane tip 100 of the vane 80 may range between 20° and 35° with respect to the vertical axis. See FIGS. 8 and 11. It has been found that tip angles in the range of 20° to 35° provide benefits over other angles because a tip angle range of 20° to 35° directs the optimal airflow to the IT racks, evenly distributing the air to the racks.

Some of the vane tips 100 of vanes 80 can have different angles of inclination α than other vane tips 100. For example, some of the vanes may have vane tips 100 having angles of inclination a of 20°, while other vanes may have vane tips 100 having an angle of inclination α of 35°. Vanes 80 having those differing vane tips may be arranged in sets, i.e., one set of the vanes 80 may have tips having an angle of inclination α of 20°, while another set of the vanes 80 may have tips having an angle of inclination α of 35°. Alternatively, as a further example, the sets of vanes may be arranged in an alternating fashion such that there is a vane having a vane tip at 20°, followed by a vane having a vane tip at 35°, followed by a vane having a vane tip at 20° or the vane tips can alternate randomly, etc., or in any other pattern. An example of another pattern is that the vanes may be arranged with a vane having a tip at 20°, followed by two vanes having a tip ant 35°, followed by a vane having a tip at 20°, followed by a vane having a tip at 35°, etc. Further, all of the vanes 80 may have angled tip portions, or alternatively only some of the vanes 80 may have angled tips with the remaining vanes being vertically oriented or inclined.

Figure 9:
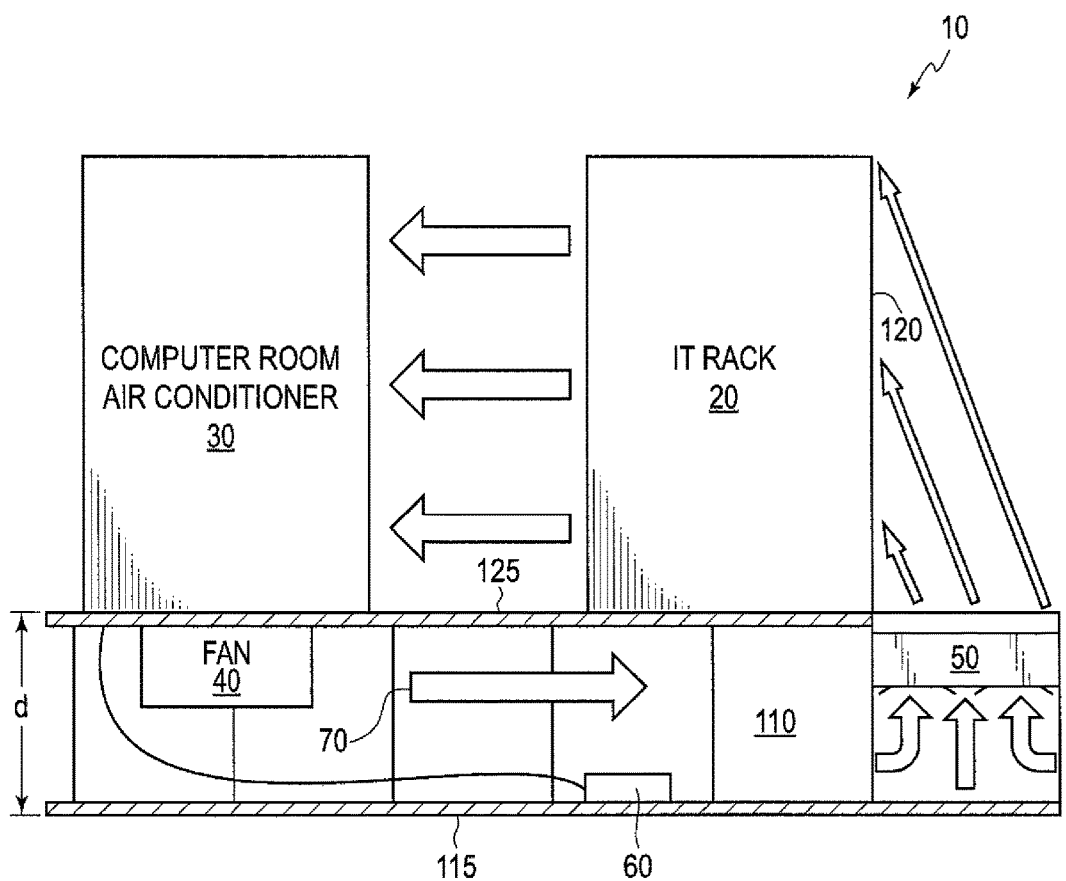
FIG. 9 is a schematic view illustrating the use of the directional grate of FIGS. 1-8 in a data center.

As stated, FIG. 9 is a schematic view of a data center, data center 10, which includes at least one directional grate panel 50. Data center 10 has one or more air conditioning units 30 that provide cool air via one or more fans 40 to the plenum 110 between the sub-floor 115 and the access floor panel array 125. An airflow 70 is created by the fan 40 through plenum 110 to the directional grate panel 50. The directional grate panel 50 is provided in the access floor array 125 adjacent to an IT rack 20. The directional grate panel 50 directs air toward a face 120 of the IT rack 20. Warm air exhausted from the IT rack is then exhausted back to the air conditioning unit 30.

The grate panels of this invention evenly distribute the air flow through them. Further, the grate panels of this invention direct a higher percentage of the cooling air toward the adjacent IT racks 20. This results in less "wasted" air, i.e., air that is circulated through the data center without interacting with the IT racks 20. Because a higher percentage of the cooling air is directed to the IT rack 20, less total CFM of the cooling air has to be delivered to each directional grate panel 50.

What has been described and illustrated herein are preferred embodiments of the invention along with some variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. An apparatus for facilitating air cooling of an IT rack of a data center, the apparatus residing within a raised floor of the data center wherein cooling air is conveyed from an under floor cooling air plenum, the apparatus comprising:
   at least one access floor panel for disposition external to the IT rack, the at least one access floor panel includes a frame supporting a plurality of spaced apart vanes for directing an air flow towards the IT rack, and the vanes positioned and set at a fixed angle which is between about 20 to 35 degrees from a plane which is perpendicular to the raised floor of the data center and
   a support housed within the frame and connected to the frame and
   the support further supporting the plurality of spaced apart fixed vanes.

2. The apparatus of claim 1, wherein the vanes have a first end and a second end, and the first end having a plane parallel to the raised floor of the data center whereby rolling loads may pass over the at least one access floor panel.

3. The apparatus of claim 1, wherein the at least one access floor panel is disposed external to a plurality of IT racks and provides cooling air to the plurality of IT racks.

4. The apparatus of claim 1, wherein the at least one access floor panel directs a high percentage of the cooling air from the under floor cooling air plenum to the IT rack.

5. A data center comprising:
   a sub floor;
   a raised floor constructed above the sub floor so as to define a plenum between the sub floor and the raised floor;
   the raised floor comprising a plurality of access floor panels,
   at least one access floor panel comprising a panel for disposition external to an IT rack;
   the at least one access floor panel including a frame supporting a plurality of spaced apart vanes for directing an air flow towards the IT rack and
   the vanes positioned at a set angle which is fixed between about 20 to 35 degrees from a plane which is perpendicular to the raised floor of the data center and
   a support housed within the frame and connected to the frame and
   the support further supporting the plurality of spaced apart fixed vanes.

6. The data center according to claim 5, wherein the vanes have a first end and a second end, and the first end having a plane parallel to the raised floor of the data center whereby rolling loads may pass over the at least one access floor panel.

7. The data center according to claim 5, wherein the at least one access floor panel is disposed external to a plurality of IT racks and provides cooling air to the plurality of IT racks.

8. A method of facilitating air cooling of an IT rack of a data center, the method comprising the steps of:
   supplying a cooling air to the IT rack,
   wherein the supplied air flows from an under floor cooling air plenum forced between a sub floor and a raised floor; and
   directing the supplied cooling air to the IT rack at a set angle which is fixed between about 20 to 35 degrees from a plane which is perpendicular to the raised floor of the data center.

9. The method of claim 8, wherein the supplied cooling air is directed to a plurality of IT racks.

10. The method of claim 8, wherein a high percentage of the directed cooling air is utilized by the IT rack.

* * * * *